(12) United States Patent
Ramaswamy et al.

(10) Patent No.: US 6,553,542 B2
(45) Date of Patent: Apr. 22, 2003

(54) SEMICONDUCTOR DEVICE EXTRACTOR FOR ELECTROSTATIC DISCHARGE AND LATCH-UP APPLICATIONS

(75) Inventors: Sridhar Ramaswamy, Plano, TX (US); Snehamay Sinha, Bangalore (IN); Gopalarao Kadamati, Plano, TX (US); Ranjit Gharpurey, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 09/775,320

(22) Filed: Feb. 1, 2001

(65) Prior Publication Data

US 2002/0144213 A1 Oct. 3, 2002

Related U.S. Application Data

(60) Provisional application No. 60/258,659, filed on Dec. 29, 2000.

(51) Int. Cl.[7] .............................................. G06F 17/50
(52) U.S. Cl. .................. 716/2; 716/1; 716/8; 716/9
(58) Field of Search ................................ 716/8, 1, 9, 2

(56) References Cited

U.S. PATENT DOCUMENTS

| 5,796,638 A | | 8/1998 | Kang et al. | |
|---|---|---|---|---|
| 5,945,833 A | * | 8/1999 | Mil'shtein et al. | 250/310 |
| 5,987,086 A | * | 11/1999 | Raman et al. | 716/11 |

* cited by examiner

Primary Examiner—Vuthe Siek
Assistant Examiner—Brandon Bowers
(74) Attorney, Agent, or Firm—Frederick J. Telecky, Jr.; W. James Brady, III

(57) ABSTRACT

For simulating electrostatic discharge and latch-up in semiconductor devices, the disclosed system and method for extracting parasitic devices combine input data from device layout, technology rules and doping profiles in order to extract netlists, element location and substrate resistance, analyze the layout for parasitic device formation, store these lists in a verification data base, translate the data base into a specific format, and finally output lists of ESD- and latch-up-sensitive elements and their locations in a specific format such as SPICE format.

11 Claims, 3 Drawing Sheets

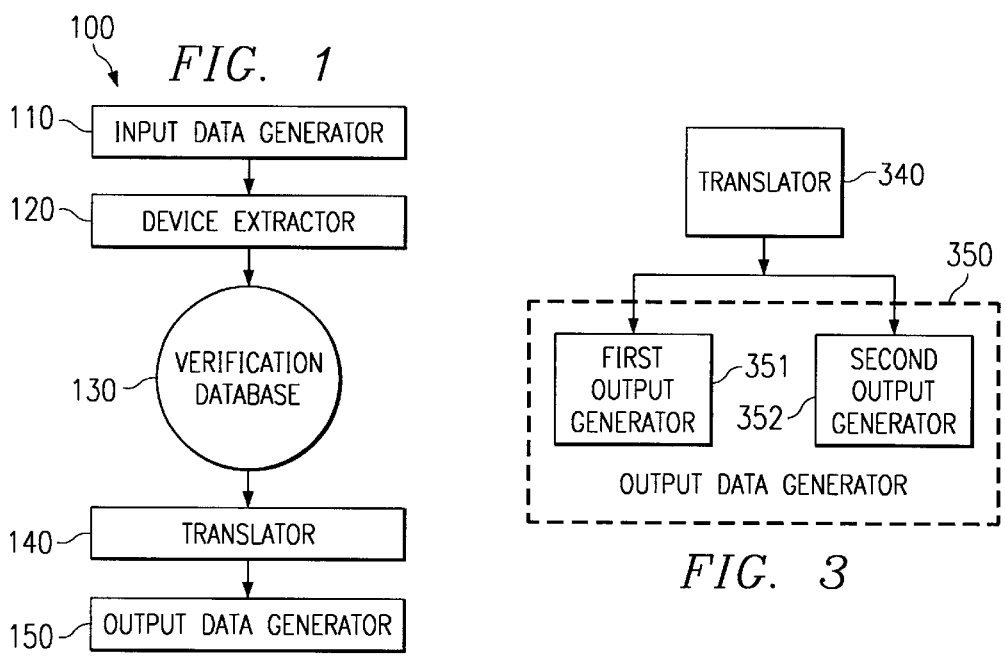
FIG. 1
FIG. 3
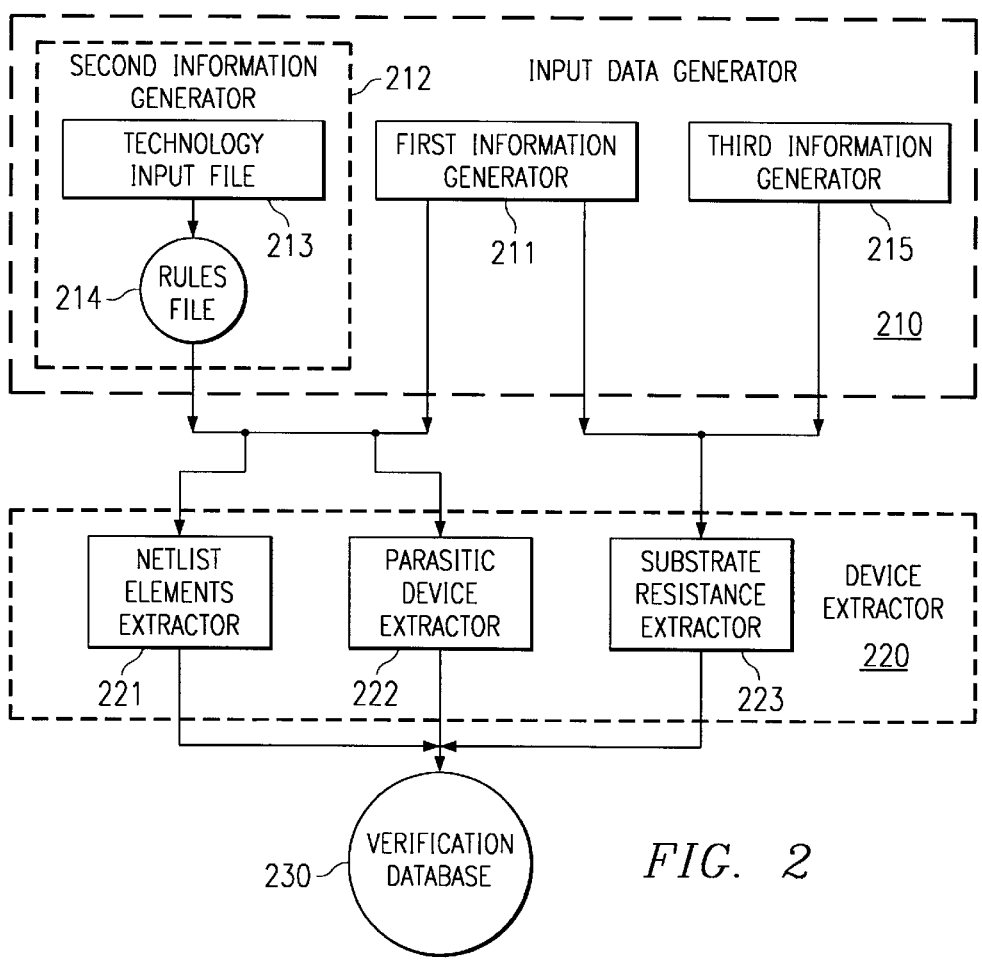
FIG. 2

SEMICONDUCTOR DEVICE EXTRACTOR FOR ELECTROSTATIC DISCHARGE AND LATCH-UP APPLICATIONS

This application claims priority under 35 USC §119 (e) (1) of provisional application No. 60/258,659 filed Dec. 29, 2000.

FIELD OF THE INVENTION

The present invention is related in general to the field of electronic systems and semiconductor devices and more specifically to automated systems and methods for simulating parasitic semiconductor device characteristics for preventing destructive electrostatic discharge.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the NMOS device width from the drain to the source under the gate oxide of the NMOS device. Under stress conditions, the dominant current conduction path between the protected pin and ground involves the parasitic bipolar transistor of that NMOS device. This parasitic bipolar transistor operates in the snapback region under pin positive with respect to ground stress events.

The dominant failure mechanism, found in the NMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger MOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses.

Solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat. No. 5,940,258, issued Aug. 17, 1999 (Duvvury, "Semiconductor ESD Protection Circuit"); U.S. Pat. No. 6,137,144, issued Oct. 24, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 3, 1999 (Amerasekera et al., "Electrostatic Discharge Device and Method").

The influence of substrate well profiles on the device ESD performance is investigated, for instance, in "Influence of Well Profile and Gate Length on the ESD Performance of a Fully Silicided 0.25 $\mu$m CMOS Technology" (K. Bock, C. Russ, G. Badenes, G. Groeseneken and L. Deferm, Proc. EOS/ESD Symp., 1997, pp. 308–315). However, known technology recommends only a lower epitaxial doping or a lower implant dose as methods to increase the p-well resistance.

In general, even good design and fabrication improvement steps are not able to completely eliminate ESD sensitivity of complex circuits. Consequently, predictive modeling at the circuit level has become extremely important since experimental methods require destructive testing and costly failure analysis to determine the effectiveness of a protection scheme. A first effort in this direction is described in U.S. Pat. No. 5,796,638, issued on Aug. 18, 1998 (Kang et al., "Methods, Apparatus and Computer Program Products for Synthesizing Integrated Circuits with Electrostatic Discharge Capability and Connecting Ground Rules therein"). A software system generates an IC schematic containing power rails and electrical paths interconnecting retrieved circuit elements and I/O pads. The resistances of the electrical paths to the I/O pads are then determined. Lengths and/or widths of the electrical paths and power rails are adjusted to eliminate/correct ground rules faults. The IC schematic is thus updated. The method is inadequate for extracting parasitic devices and considering substrate resistance effects.

Another design and verification effort is described in U.S. Pat. No. 6,086,627, issued on Jul. 11, 2000 (Bass et al., "Method of Automated ESD Protection Level Verification"). Minimum wire width and maximum resistance constraints are applied to each of the chip's I/O ports. These constraints are propagated to the design and then verified; power rails are similarly checked. The method is inadequate for extracting parasitic devices and considering substrate resistance effects.

Modeling examples for designing and analyzing ESD protection circuits and detecting ESD design errors have been described in the papers "Modeling MOS Snapback and Parasitic Bipolar Action for Circuit-Level ESD and High Current Simulations" (by A. Amerasekera, S. Ramaswamy, M. C. Chang, and C. Duvvury, Proc. Int. Reliab. Phys. Symp. 1996, pp. 318–326; extensive literature reference list), and "An Automated Tool for Detecting ESD Design Errors" (by S. Sinha, H. Swaminathen, G. Kadamati, and C. Duvvury, EOS/ESD Symp. 1998, pp. 208–217). In these papers, a system and flow are outlined to check a given IC design for ESD performance. The impact on detecting faulty IC component values and design errors is illustrated by a number of examples. However, contributions and impact of the substrate resistance network are not considered and options for optimizing the circuit parameters are not offered.

An urgent need has, therefore, arisen for a coherent, low-cost system and method of simulating ESD for ICs in the design stage, especially an extraction of parasitic devices, their location and correction. The extraction should be simple, yet flexible enough for different semiconductor product families and a wide spectrum of design and process variations. Preferably, these innovations should also shorten IC design cycle time.

SUMMARY OF THE INVENTION

For simulating electrostatic discharge and latch-up in semiconductor devices, the disclosed system and method for extracting parasitic devices combine input data from device layout, technology rules and doping profiles in order to extract netlists, element location and substrate resistance, analyze the layout for parasitic device formation, store these lists in a verification data base, translate the data base into a specific format, and finally output lists of ESD- and latch-up-sensitive elements and their locations in a specific format such as SPICE format.

The present invention is related to high density ICs, especially those to be used at very high frequencies and having high numbers of input/outputs, tight design and layout rules, and a complex flow of fabrication steps. These ICs can be found in many semiconductor device families such as microprocessors, digital signal processors, standard linear and logic products, digital and analog devices, high frequency and high power devices, wireless and both large and small area chip categories. Since the invention aims at designing devices with minimum geometries and high reliability, it supports continually shrinking applications such as cellular communications, pagers, hard disk drives, laptop computers and medical instrumentation.

It is an aspect of the present invention to provide an automated system and method for extracting parasitic semiconductor devices and components affecting electrostatic discharge and latch-ups. The aspect is achieved by defining a set of rules to recognize the critical parasitic paths and then placing these paths as part of the netlist.

Another aspect of the present invention is to provide a highly flexible system and method. This object is achieved by the embodiments of two subsystems of the invention:

An input data generator drawing from three sources:
circuit layout and design, supplied by the master layout file;
technology (such as different mask layers) and process (such as minimum spacing and sheet resistances); and
doping profiles, supplied by a process flow file.

A device extractor comprising three specific extractors:
a netlist and elements extractor;
a substrate resistance network extractor; and
a parasitic device extractor.

Another aspect of the present invention is to provide the computer system output in specific formats or displays directly useful to circuit designers. This aspect has been achieved by the embodiments of two output generators:

A first output generator creating a netlist of ESD parasitic and ESD sensitive elements; and a second output generator creating a location and geometry list of parasitic and ESD sensitive elements.

Another aspect of the present invention is to introduce computer concepts which are flexible so that they can be applied to several performance criteria of integrated circuits, such as ESD and latch-ups, and are general so that they can be applied to several generations of products.

These aspects have been achieved by teachings and embodiments of the invention. Various modifications have been successfully employed to satisfy different selections of product geometries, processes and characteristics. The method of the invention provides easy expansion to new IC designs, and easy specialization to customer-specific requirements.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 illustrates a block diagram of a computerized system for extracting parasitics and device elements in order to check semiconductor circuit designs for electrostatic discharge and latch-up sensitivities.

FIG. 2 illustrated a block diagram of the detail of the input data generator and the device extractor according to the invention.

FIG. 3 illustrates a block diagram of the detail of the output data generator according to the invention.

DETAILED DESCRIPTION OF THE PREFERRED EMBODIMENTS

Figure 4A:
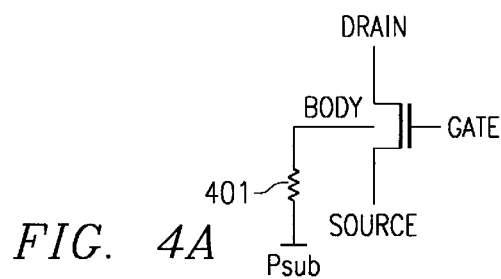
FIGS. 4A and 4B depict MOSFET schematics with substrate resistance added according to the invention.

The present invention is related to U. S. Pat. No. 5,796, 638, issued on Aug. 18, 1998 (Kang et al., "Methods, Apparatus and Computer Program Products for Synthesizing Integrated Circuits with Electrostatic Discharge Capability and Connecting Ground Rules Faults therein"), which is herewith incorporated by reference.

The present invention satisfies the electrostatic discharge (ESD) needs in the semiconductor industry as summarized in the paper "ESD: Design for IC Chip Quality and Reliability" (C. Duvvury, Int. Symp. Quality in El. Designs, 2000, pp. 251–259). The needs can be stated as:

Perform circuit simulations to simulate HBM, MM, and CDM ESD events on any piece of circuit and identify ESD failure in devices;

simulate the effect any circuit change has on ESD failure, which helps in faster design of ESD-robust circuits to optimize the circuit parameters, like MOS widths and gate lengths, to achieve the best conditions for avoiding ESD failure;

be able to model the substrate resistance network of multi-fingered devices; and analyze the circuit design for latch-up sensitivity as well as for ESD sensitivity.

As illustrated schematically in the simplified block diagram of FIG. 1, the system of the present invention, generally designated 100, operates to automatically select inputs from several files, analyze them following a set of rules, extract elements identified by their locations and netlists which are found sensitive to ESD and latch-up effects, verify the findings, and output the results in a format suitable for circuit design and layout.

An input data generator 110 is capable to obtain information from a number different files for design, layout, and technology/processes. Input generator 110 is connected to the device extractor 120, capable of pulling together netlists, elements and parasitics lists, and substrate resistance values. These data are then checked against technology-based rules for ESD and latch-up, stored in the verification database 130 and converted, by translator 140, into formats such as SPICE useful for IC designers. The translator 140 is connected to the output generator 150, which presents the netlists and location and geometry lists of parasitic and ESD and latch-up sensitive elements in user-oriented format.

The device extractor system 100 can automatically analyze designs, before any actual semiconductor ICs are fabricated, in order to identify structures sensitive to ESD and latch-up and thus offer the designer a chance to improve questionable design structures while corrections are still easy and inexpensive. System 100 is flexible and can be used for any ICs manufactured by bipolar, MOS and CMOS technologies. For an embodiment in a computer system, examples of the requirements are as follows:

| Hardware: | |
| --- | --- |
| Platform/ | SUN SPARC station, such as 4/60, 4/65, 4/75 |
| Model | HP 9000 Series 700, such as 710, 720 |
| Memory | 64 Mbytes |
| Disk | 100 Mbytes minimum |
| Peripherals | None |
| Software: | |
| Operating | SOLARIS 2.5 and above |
| System | HP 9000 Series 700, such as HP-UX 9.X |
| | Any X Window ™ Manager |
| Technology | Independent |
| Input | CADENCE Composer ™, layout |
| | MENTOR Graphics Design Architect ™, netlists |
| | K2 Technologies, layout verification |
| Output | SPICE ("Simulation Program with Integrated Circuit Emphasis") for use with IC designs |

The "Layout Verification" program is commercially available from K-2 Technologies, Dallas, Tex., USA.

An embodiment of the computer system of the present invention is illustrated in more detail by the schematic block diagrams of FIGS. 2 and 3. The major parts of the computer system are, analogous to FIG. 1, the input data generator 210, the device extractor 220, the verification database 230, the translator 340, and the output data generator 350.

The input data generator 210 has the first information generator 211, the second information generator 212, and the third information generator 215. These input generators are distinguished by the categories of data they provide and are responsible for the flexibility to various process technologies. The first information generator 211 selects data related to circuit layout and physical design from a master layout file/database; it contains all circuit connections at internal nodes and pad nodes.

The second information generator 212 selects data related to the particular technology, selected by the user for the fabrication of the circuit, from a technology input file 213. Among many others, such data include for example different mask levels for that technology, minimum spacing between different layers, sheet resistances, silicided parts/information, channel lengths, epitaxial parts/information, design shrink factors, and ESD-specific values. This information is used to create a process- and design-specific ESD/latch-up checker.

The technology input file 213 is coupled to the rules file 214. It contains, for instance, the ESD and latch-up geometric/spacing rules. Once the user specifies the technology name, the rules for that technology with all the appropriate layer names and spacing parameters are created from the rules template. The rules file created from the template is then used to carry out the device extraction and design rule checking. The set of "rules" are written to instruct the device extractor 220 what devices to extract and how the design rule checking has to be done. Since it is not necessary to extract all devices in the layout to carry out ESD/latch-up checks, the rules are tailored to allow selective extraction of only devices relevant to ESD/latch-up guidelines in the layout. The relevant devices are grouped according to their function (for instance, ESD protection, and input/output buffers) during the extraction (see below).

As shown in FIG. 2, the input data generator 210 is connected to the device extractor 220. Specifically, the first information generator 211 and the second information generator 212 are connected to the netlist and elements extractor 221 and the parasitic device extractor 222. The first information generator 211 and the third information generator 215 are connected to the substrate resistance extractor 223.

The netlist and elements extractor 221 verifies the devices layout, extracts the netlist and element locations list from the layout, and verifies these netlist and locations lists by checking them against the technology and process rules.

The substrate resistance extractor 223 solves POISSON's differential equation (for the static electric field/electrostatic potential in space having a density of electric charge-sources) based on device layout inputs, and generates a resistive netlist on a specific format such as SPICE.

The parasitic device extractor 222 analyzes the circuit layout for parasitic device and component formation.

The devices extracted by the ESD/latch-up checker rules are as follows:

Those devices which are recommended as protection devices in the ESD/latch-up guidelines. These devices are extracted on the basis that a special layer called ESD layer covers them.

Those input and output buffers whose parameters need to be checked against the values recommended in the ESD/latch-up guidelines. These devices are extracted on the basis that they are not covered by the ESD layer and are connected to a bond pad either directly or through certain layout/component combinations.

Those inverters whose bus resistance between the inverter ground/power supplies need to be checked against the recommended values in the ESD/latch-up guidelines. These devices are extracted based on their connectivity.

Those parasitic resistances of the power and ground buses, which are required to carry out the bus resistance based checks. The power and ground buses are extracted as parasitic resistors, which are then used to determine the bus resistance between the points of interest.

As FIG. 2 indicates, the device extractor 220 is connected to the verification database 230. This data base 230 stores the netlist, locations list, resistance list, parasitic device information, and the device parameters identified by extractor 220. It is shown in FIG. 1 that all the information stored in the verification data base (130 in FIG. 1) is connected to the translator (140 in FIG. 1), operable to generate the list quoted above in a specific format.

The translator 340 in FIG. 3. The commonly preferred specific format is SPICE. The translator, in turn, is connected to the output data generator 350, which consists of the first output generator 351 and the second output generator 352. The first output generator 351 creates a netlist of parasitic and ESD and latch-up sensitive elements, frequently expressed in the widely used SPICE format. The output SPICE netlist may also contain parasitic RC's. Furthermore, parasitic npn, pnp, and pnpn unintentional devices, as extracted by the layout verification, may be included in the output.

The second output generator 352 creates a locations and geometry list of the parasitic and ESD and latch-up sensitive elements, again frequently expressed in the widely used SPICE format.

Figure 4B:
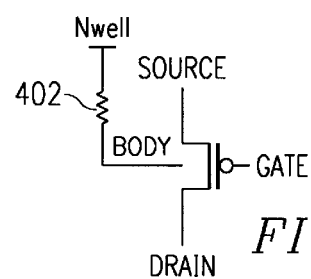
Figure 4C:
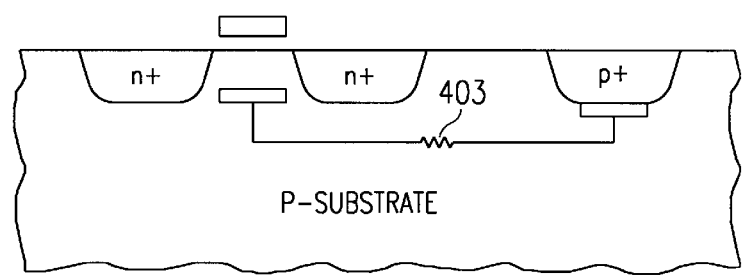
FIGS. 4C and 4D depict MOSFET 2-d cross sections with substrate resistance added according to the invention.
Figure 4D:
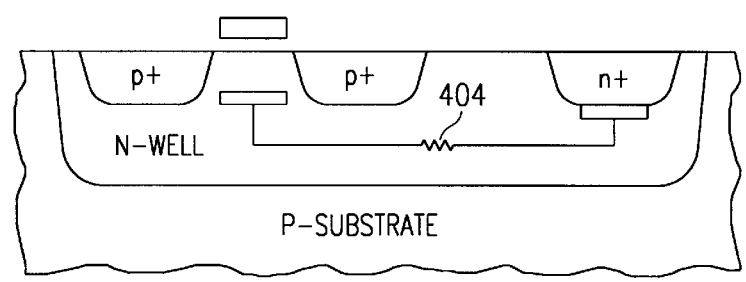

By way of example, FIGS. 4A to 4D illustrate schematically an ESD/latch-up MOSFET model including the substrate resistance, added externally to the MOSFET, as extracted by the present invention. Since existing extracted netlists do not include all relevant parasitics critical for ESD/latch-up events, one cannot get an accurate representation of the current flow. Based on the invention, a set of rules is defined to recognize the critical parasitic paths, which are then placed as part of the netlist. In the schematics of FIGS. 4A and 4B, the substrate resistance need to be physically added, in FIG. 4A as tie 401 to the p-substrate, in FIG. 4B as tie 402 to the n-well. In the layouts of FIGS. 4C and 4D, the relevant geometries are extracted from a layout file, which are then used to construct the substrate (or well) resistance network. For the NMOS transistor in FIG. 4C, the resistance 403 is indicated in the p substrate; for the PMOS transistor in FIG. 4D, the resistance 404 is indicated in the n-well.

Figure 5:
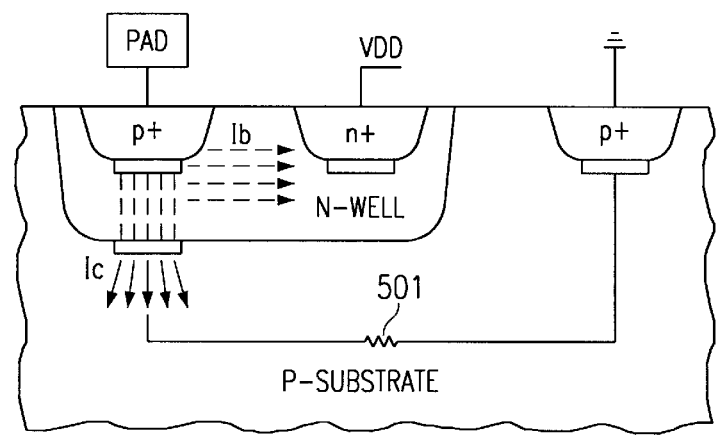
FIG. 5 is a schematic cross section of a bipolar transistor with substrate resistance indicated according to the invention.

An analogous example for bipolar transistor models is illustrated in the schematic FIG. 5. Using a standard GUMMEL-POON model for bipolar transistors, the base-resistance modulation at high current levels (ESD event) is calculated. Following the geometries of FIG. 5, the additional resistance 501 in the p-substrate, as experienced by high collector currents Ic, is compared to the n-well resistance as experienced by the base current Ib, resulting in the resistance network in an ESD or latch-up event. The transistor parameters are extracted at high current levels.

Figure 6:
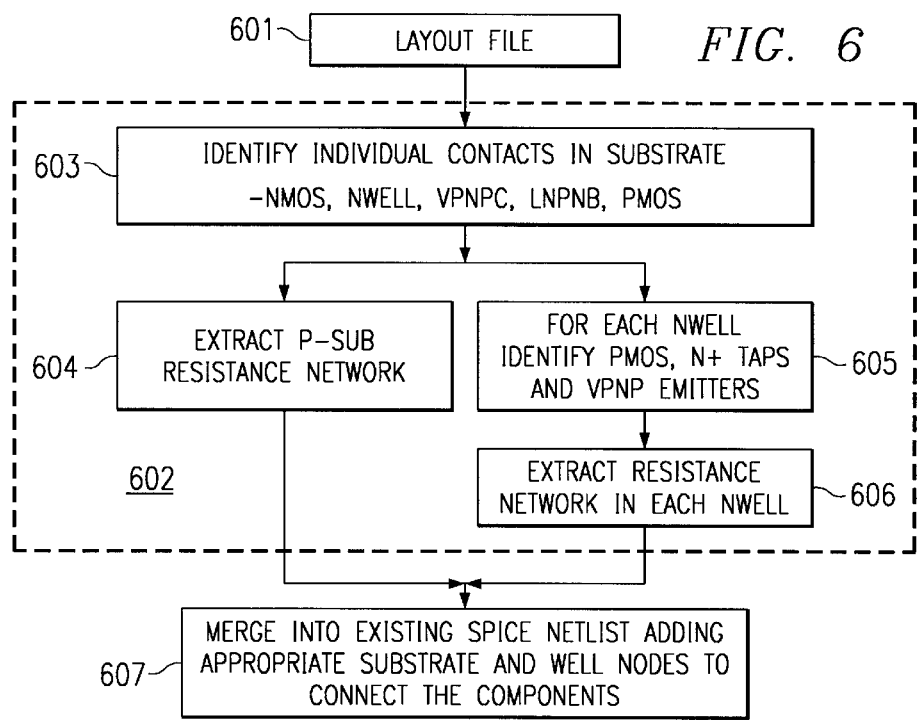
FIG. 6 illustrates a block diagram of the substrate resistance extraction flow according to the invention.

The substrate resistance extraction indicated in FIGS. 4A to 4D and FIG. 5 is depicted as an extraction flow in the block diagram of FIG. 6 (which follows the block diagram of FIG. 1). Layout file 601 serves as the input data generator. In the device extractor 602, the computer process steps flow as indicated:

Step 603: Identifying individual contacts in the substrate;
Step 604: Extracting p-substrate resistance network; or alternatively,
Step 605: Identifying PMOS, n taps and VPNP emitters for each n-well; followed by:
Step 606: Extracting resistance network in each n-well.

In step 607, the findings of the device extraction 602 are merged into the verification database and translated into the SPICE format. As a result, the additional substrate resistances, needed for ESD/latch-up simulation, are identified by entries into the netlist (web of nets/nodes, action/distribution points);
elements list (electronic components); and
locations list (coordinates of each element).

Consequently, the ESD/latch-up sensitive design features, and any circuit level violations, detected by the checking procedure of this invention are compiled in the output data generators with x-y coordinates of the geometries as well as the pad signal names.

Many circuit designs offer the unintentional opportunity for parasitic vertical devices, such as a vertical pnp device (VPNP), to appear in ESD/latch-up events. An example has been described in FIG. 11 of the publication "ESD: A Pervasive Reliability Concern for IC Technologies" (C. Duvvury and A. Amerasekera, IEEE Proc., vol. 81, pp. 690–702, 1993). Referring to the schematic top view of FIG. 7A and the schematic cross section of FIG. 7B, the software flow for parasitic VPNP device extraction, along with the relevant layers and contacts, progresses in somewhat more detail in the following sequence:

Step 1: Input layers DIODE, NMOAT (701), PMOAT (702), NWELL (703), ESD and POLY;
Step 2: Identify all NMOATs that are not NMOS devices;
Step 3: Identify all PMOATs that are not PMOS devices;
Step 4: Extract geometries corresponding to anode and cathode terminals of the P+–N–N+ diodes in the NWELLs;
Step 5: The VPNP_BASE (704) is identified as the portion of the NWELL (703) that lies under VPNP_EMIT. The PMOAT touching the VPNP_BASE is the emitter (705) while the collector (706) geometry is the projection of the emitter into the p-substrate.
STEP 6: The circuit interconnection section defines how the VNPN device hooks up to the circuit;
Step 7: Device definition section: the vertical PNP device is being defined;
Step 8: Output the relevant geometries which identify the vertical PNP device.

Figure 7A:
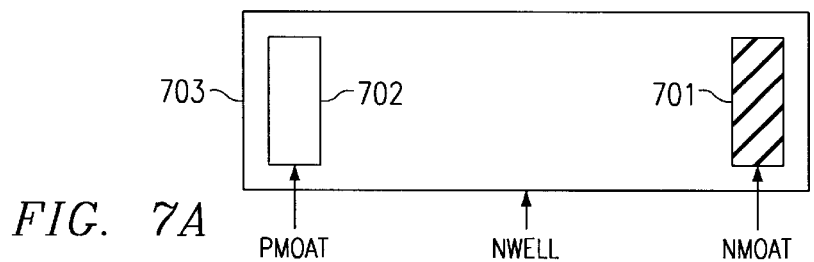
FIG. 7A (schematic layout) and FIG. 7B (schematic cross section) illustrate the parasitic device extraction in the example of the ESD simulation flow.
Figure 7B:
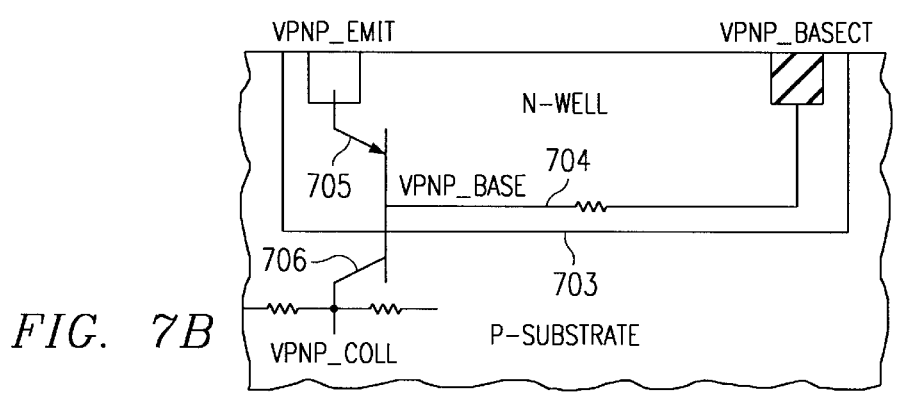

As the example in FIGS. 7A and 7B indicates, the automated extractor system can ensure that the protection circuit used with a pad is compatible with the pad type. The signal name of a particular pad is employed as a reference variable and the signal is tracked until all devices associated with that signal are collected. After the devices are collected, the system is capable of identifying the pad type (for example, input, output, I/O, power, or ground) and checking whether the circuit associated with this pad matches the one mentioned in the guideline in the particular technology.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A computerized system for minimizing electrostatic discharge (ESD) and latch-up sensitivities in a semiconductor circuit design, comprising:
   an input data generator operable to generate information describing circuit layout, technology rules, process results, and ESD rules;
   a device extractor, coupled to said input data generator, operable to extract netlist, locations and parasitic substrate resistance data, as analyzed by said rules;
   a verification data base, coupled to said device extractor, operable to store said netlist, locations list and resistance list into said verification database;
   a translator, coupled to said verification data base, operable to generate said netlist, locations list and resistance list in a specific format from said verification database;
   an output data generator, coupled to said translator, operable to create netlists and location lists of parasitic, ESD- and latch-up-sensitive elements, said lists expressed in specific formats or displays.

2. The system according to claim 1 wherein said device extractor comprises a layout verification software program.

3. The system according to claim 1 wherein said specific format is the SPICE format.

4. The system according to claim 1 wherein said input data generator comprises:
   a first information generator operable to generate data related to circuit layout and design from a master layout file;
   a second information generator operable to generate data related to technology and processes; and
   a third information generator operable to generate doping profile data from a process flow file, and layout data.

5. The system according to claim 4 wherein said second information generator comprises:
   a technology input file comprising information related to design, mask layers, processes, minimum spacing, sheet resistances, and ESD-specific values; and
   an ESD and latch-up rules file created from a rules template being applied to said technology input file.

6. The system according to claim 4 wherein said device extractor comprises:
   a netlist and elements extractor, coupled to said first and second information generators, operable to verify said device layout, to extract the netlist and element locations from said layout, and to verify said netlist and locations list by checking them against said technology and process rules;
   a substrate resistance network extractor, coupled to said first and third information generators, operable to solve POISSON's equation based on device layout inputs, and generate a resistive netlist in a specific format; and
   a parasitic device extractor, coupled to said first second information generators, operable to analyze said circuit layout for parasitic device and component formation.

7. The system according to claim 1 wherein said output data generator comprises:
   a first output generator, coupled to said translator, operable to create a netlist of parasitic and ESD and latch-up sensitive elements, said list expressed in specific formats or displays; and
   a second output generator, coupled to said translator, operable to create a location and geometry list of parasitic and ESD and latch-up sensitive elements, said list expressed in specific formats or displays.

8. A computer-implemented method for minimizing electrostatic discharge and latch-up sensitivities in a semiconductor device design, comprising the steps of:
   generating input data describing circuit layout, rules for technology, ESD and latch-up, and process results used in said design of said semiconductor device;
   extracting netlist, locations and parasitic substrate resistance lists from said input data;
   analyzing said extracted lists against said rules for ESD and latch-up;
   storing said netlist, locations list and resistance list into a verification database;
   generating said netlist, locations list and resistance list in a specific format from said verification data base; and
   creating summary netlists and locations lists of parasitic and ESD- and latch-up-sensitive elements, said lists expressed in specific formats or displays.

9. The computer-implemented method according to claim 8 wherein said step of generating input data comprises the steps of:
   generating data related to circuit layout and design from a master layout file, and storing said data in the first input file;
   generating data related to technology and processes used in said design of said semiconductor device;
   creating an ESD and latch-up rules file by applying an ESD and latch-up rules template to said technology and processes data, and storing said data in the second input file; and
   generating doping profile data from a process flow file, and storing said data in the third input file.

10. The computer-implemented method according to claim 8 wherein said step of extracting data comprises the steps of:
    extracting a netlist and an elements list by executing the steps of:
      selecting data from said first and second information generators;
      verifying said circuit layout;
      extracting said netlist and said element locations list from said layout;
      verifying said netlist and said elements locations list by checking them against said technology and process rules;
    extracting a substrate resistance network by executing the steps of:
      selecting data from said first and third information generators, said data related to circuit layout;
      solving POISSON's equation; and
      creating a resistive netlist in a specific format; and
    extracting a parasitic device list by executing the steps of:
      selecting data from said first and second information generators;
      analyzing the circuit layout, based on layout verification, for parasitic device and component formation, including parasitic and unintentional RCs, npn, pnp, and pnpn devices.

11. The computer-implemented method according to claim 8 wherein specific format of the summary lists is the SPICE format.

* * * * *